United States Patent [19]

Saville

[11] Patent Number: 4,655,315

[45] Date of Patent: Apr. 7, 1987

[54] SPEAKER SYSTEM

[76] Inventor: Robert W. Saville, 340 Linden Ave., Lake Forest, Ill. 60045

[21] Appl. No.: 755,785

[22] Filed: Jul. 17, 1985

[51] Int. Cl.⁴ .................................................. H05K 5/00

[52] U.S. Cl. ..................................... 181/153; 181/156; 181/199

[58] Field of Search ............... 181/153, 156, 197, 199, 181/196

[56] References Cited

U.S. PATENT DOCUMENTS

| | | | |
|---|---|---|---|
| 3,393,766 | 7/1968 | Mitchell | 181/153 X |
| 3,443,660 | 5/1969 | Virua et al. | 181/153 X |
| 3,523,589 | 8/1970 | Virua | 181/151 |
| 3,945,461 | 3/1976 | Robinson | 181/153 |
| 3,993,162 | 11/1976 | Juuki | 181/156 |
| 4,164,988 | 8/1979 | Virua | 181/156 |
| 4,210,778 | 7/1980 | Sakurai et al. | 181/156 X |

*Primary Examiner*—Benjamin R. Fuller

[57] ABSTRACT

A speaker system comprises a plurality of serially connected, angularly disposed hollow tubes having a total mean axial length of one-quarter wavelength of the desired lowest frequency response of the speaker system, the speaker system providing, with a single small speaker, the entire frequency range normally provided from a woofer, a midrange and a tweeter while eliminating the phase distortion and the phase problems resulting from dividing networks.

18 Claims, 8 Drawing Figures

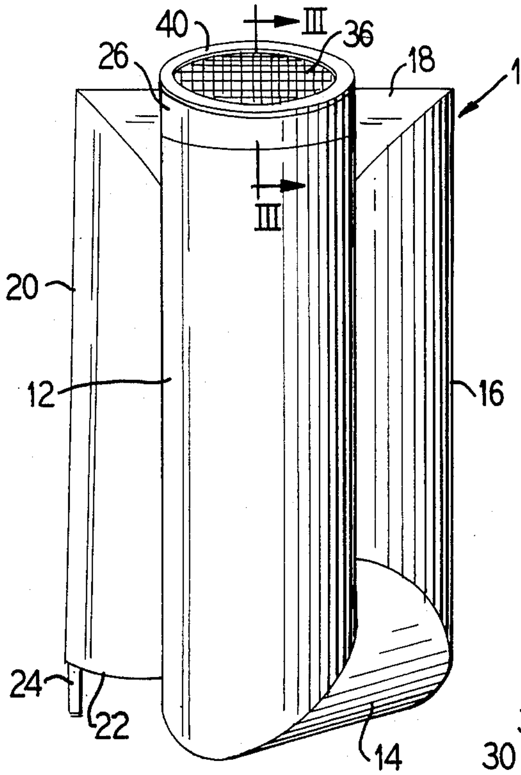
FIG. 1
FIG. 2
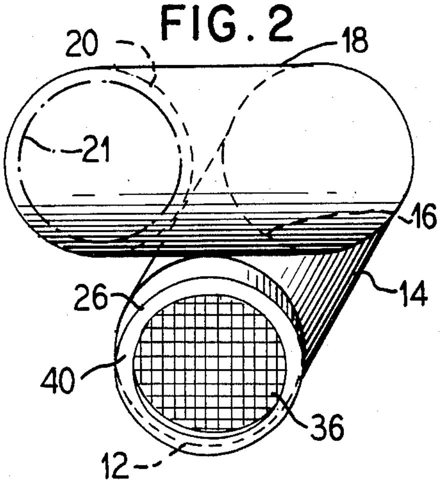
FIG. 3
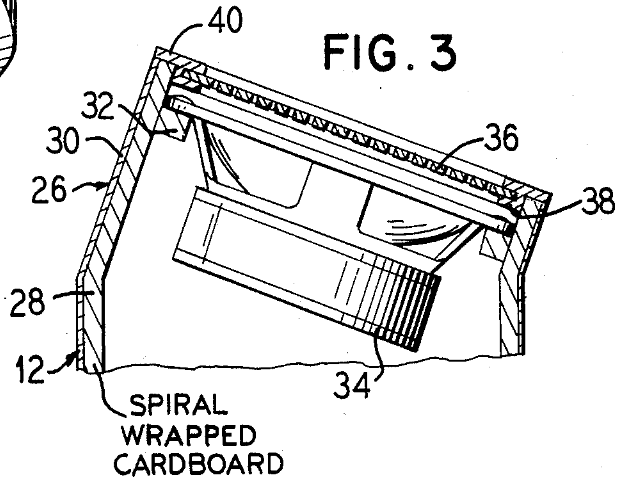
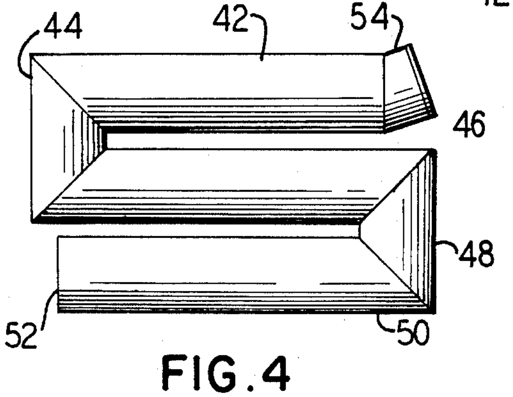
FIG. 4
FIG. 5
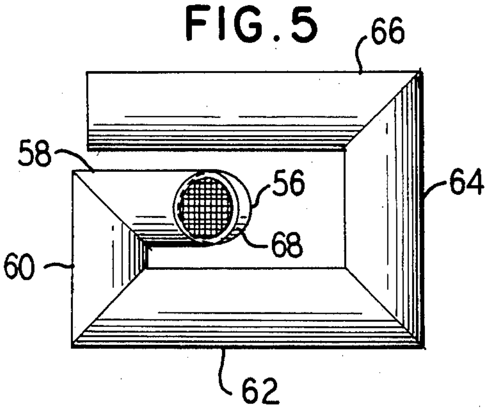

SPEAKER SYSTEM

BACKGROUND OF THE INVENTION

1. Field of the Invention

The present invention relates to a speaker system and is particularly concerned with a speaker system which is small, directive with respect to sound emission, and which provides a full frequency range from a small speaker.

2. Description of the Prior Art

A speaker system is disclosed in Australian Pat. No. 143,597 in which a speaker is mounted in the upper end of a tube and directed toward a diffusion cone. The tube is mounted on legs so that the lower end thereof is located above the floor. With the exception of a plurality of struts, each having a central opening, the tube is hollow and lined with sound absorbing material. The tube is constructed of an arcuate plywood member with a generally flat, but inwardly curved rear panel so that the tube may stand close to a wall. The diffusor or reflector cone is mounted above the speaker to provide approximately 180° sound distribution at the high frequencies.

The theory of operation of this speaker system is that, if the speaker with a certain fundamental low frequency resonance is located at the end of a column of length of approximately ¼ of the wavelength (in air) at that frequency (approximately because wavelength varies with pressure and also effective column length is affected by "fringing" at an open end), then at that frequency the acoustic impedance of the column is infinite. In theory, the speaker resonance is damped and is replaced by two less violent resonances, one above and one below the speaker resonance. In demonstrating the above, the Australian patent compares the same with an analogous electrical series resonance circuit with reference to FIG. 3 of that patent. At low frequencies, the equivalent electrical circuit of the mechanical portion of a speaker comprises a capacitor analogous to the compliance of the cone suspension, an inductance analogous to the cone mass, and a resistance analogous to the mechanical resistance to motion, and a further resistance and inductance which are in series with the foregoing elements and parallel to one another and analogous to the air load. Furthermore, an analogous electrical circuit of the column comprises a resistor, an inductance and a capacitance connected in parallel which are analogous to the frictional and viscous losses in the column together with the column radiation resistance at the open end, the mass of the air column and the compliance of the air column, respectively.

When the speaker is located at one end of the column, the two circuits are connected in series to provide a further equivalent circuit.

The resonant frequency of the speaker is determined by a predetermined relationship set forth in the center of columns 5 and 6 of the patent and the combined equivalent electrical circuits have two principle resonant frequencies, one above and one below, and both less violent than the fundamental resonant frequency of the speaker. Of these principle resonances, the lower resonance extends the speaker response downwardly and the higher response lifts the trough of the falling low frequency response curve adjacent to the normal low frequency resonance. Between the two, where the speaker resonance would ordinarily have been, there is a "dip" which will be deep or shallow according to a number of factors, principally the various acoustic resistances present. This reference is fully incorporated herein and may be referred to for a more complete discussion. However, the speaker system is based on the provision of a column vertical axis at which the speaker is mounted above the open base of the column equal to a distance of ¼ wavelength of the bass resonant frequency of the speaker.

In an article entitled "Build EI's Sub-Mini Speaker, Electronics Illustrated, November 1965, F. David Herman provides a step-by-step method of making a small speaker. In that article, a 4" speaker having a power rating of 3 watts nominal and 15 watts music power is employed in a stiff cabinet along with a contour network to match the speaker and the cabinet. The resulting speaker system provides a flat response, within 2 dB, from about 120 Hz to 14 kHz, with no prominent mid-range or upper end.

Herman states that one will not obtain knee-bending bass in that the same is virtually impossible with a 4" speaker in any enclosure.

The above may appear to be inconsistent with the teachings of the Australian patent; however, when one takes into account that the Australian patent refers to a larger speaker and a column radius of 7½ inches, the differences in structure become quite apparent in that the larger speaker will normally produce a greater bass response, but with a reduction of higher frequency response due to larger cone weight.

SUMMARY OF THE INVENTION

The object of the present invention is to provide a full frequency range from a single small speaker with a light-weight cone and to provide efficient low frequency response.

An attendant object of the invention is to provide a single speaker for covering the entire audio frequency spectrum while eliminating the phase problems resulting from dividing networks currently used to divide the sound from woofer to mid-range to tweeter as is present in all or most currently manufactured speakers, and the resulting problems of phase distortion.

The above object is achieved by employing the ¼ wavelength principle of the Australian patent in a unique tubular design suitable for small speakers, the speaker system structure being such that an overall small structure results. An advantageous feature of the invention, is that the low end response may readily be designed for a 40, 50, 60 Hz, or the like, ¼ wavelength in which the total length of the column varies slightly from one wavelength to another, and even less in accordance with the present structure, as will be apparent from the description below.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a perspective view of a first embodiment of a speaker system constructed in accordance with the present invention;

FIG. 2 is a top view of the speaker system of FIG. 1;

FIG. 3 is a sectional view taken substantially along the line III—III of FIG. 1;

FIG. 4 is an an elevation view of a second embodiment of the speaker system constructed in accordance with the present invention;

FIG. 5 is a top view of a third embodiment of a speaker system constructed in accordance with the present invention;

DESCRIPTION OF THE PREFERRED EMBODIMENTS

Figures 6, 7:
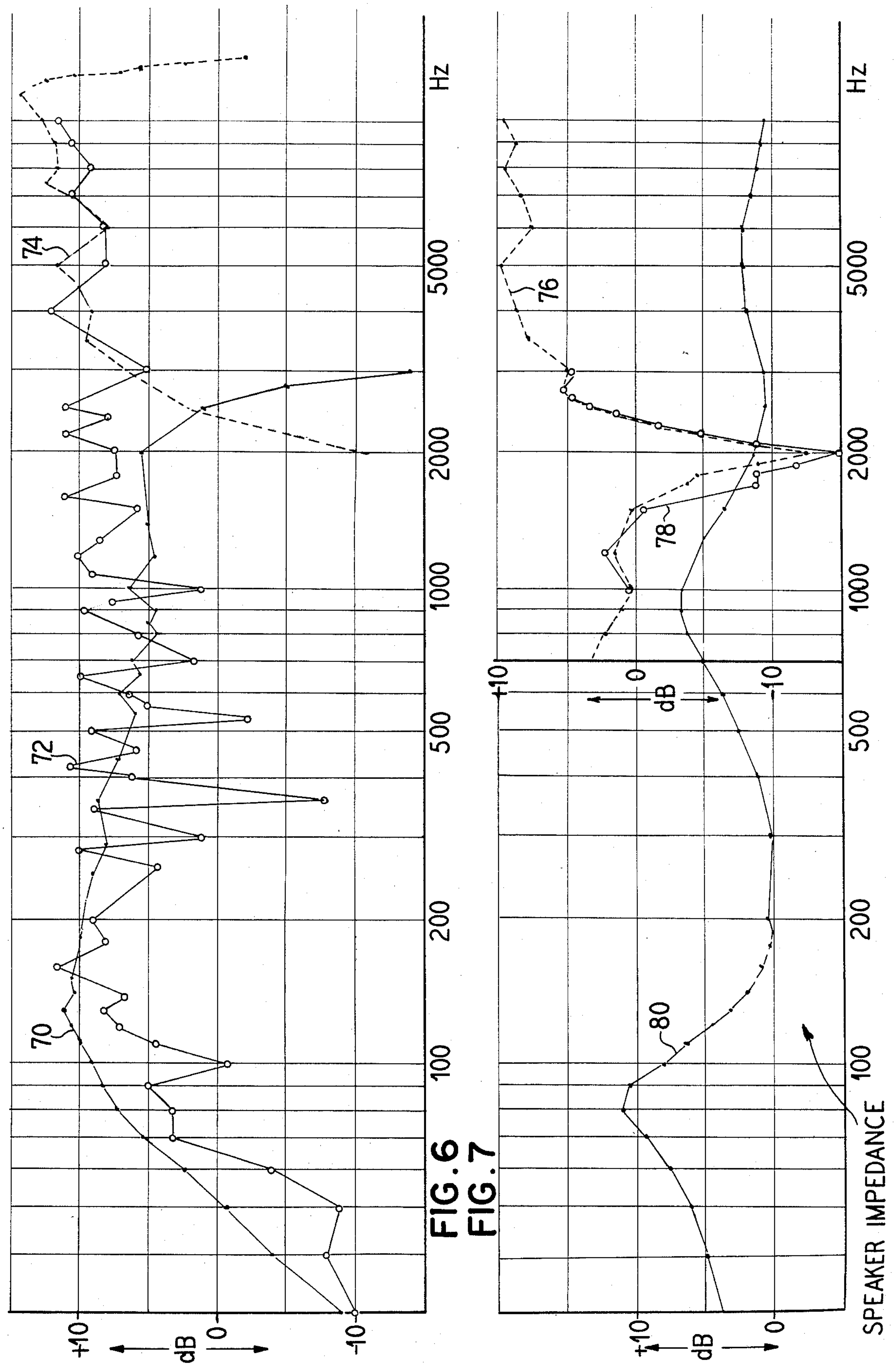
FIGS. 6 and 7 are performance curves of a typical small speaker system presently on the market.

Referring to FIGS. 1, 2 and 3, a first embodiment of the invention is illustrated as comprising a plurality of serially connected hollow tube 12, 14, 16, 18 and 20. The end tube 20 has an open end 22 which is supported by a leg 24, with the remainder of the structure supported on the lower edge of the tube 14. In this embodiment, as with the other embodiments, each of the tubes is connected to the adjacent tube or tubes at a 90° angle.

At the upper end of the tube 12 is a mating tubular section 26 which mounts a speaker (as best seen in FIG. 3). Referring specifically to FIG. 2, an element 21 is illustrated in phantom, the element 21 being a fiberglass wool material or the like which may be located in any of the tubes and which may, for example, have the dimensions of ½"×16"×12".

Referring specifically to FIG. 3, the section 26 is joined to the tube 12, as by gluing or the like, and places the speaker at a non-critical angle for sound dispersion throughout a room. As illustrated, the tube 12, and also the other tubes and the section 26, may advantageously comprise a spiral wrap cardboard tube 28 faced with an adhesive covering 30 for asthetic purposes. Located within the section 26 is a ring or plurality of spaced elements 32 for supporting a speaker 34 which is affixed thereto by a suitable fastening means, such as screws or silicon rubber, etc. Above the speaker 34 is a similar arrangement 38 supporting a ring 40 which clamps a grill 36.

Referring again to FIG. 1, this particular embodiment of the invention provides that the tube 20 has a mean axial length of 19", the tube 18 has a mean axial length of 12½", the tube 16 has a mean axial length of 20½", the tube 14 has a mean axial length of 12¼", and the mean overall length from the speaker to the open end 22 is 61". Each tube is 5¼" ID×5⅝" OD. The speaker 34 is a product of Oaktron of Monroe, Wis., Model No. T-8773; the speaker has a 5" OD with a 10 OZ magnet 8 ohm voice coil.

The performance of this speaker system will be set forth in detail below.

Referring to FIG. 4, a Z-configuration of a speaker system is illustrated as comprising a plurality of serially connected tubes 42, 44, 46, 48 and 50, the tube 50 having an open end 52 which may be supported by a pair of legs if the speaker system is to stand 90° from the position illustrated. At the opposite end of the tubes is a section 54 which is identical in construction to the section 26 of FIGS. 1–3.

Referring to FIG. 5, a flat system is illustrated as comprising a plurality of serially connected tubes 56, 58, 60, 62, 64 and 66, the tube 66 again having an open end. At the opposite end of the series connection is a section 68 which is identical to the sections 54 and 26 of FIGS. 1–4. The embodiment of FIG. 5 is a top view in which the tubes 58–66 lie on the floor or other supporting surface.

Referring to FIGS. 6 and 7, sound pressure curves are illustrated for a known B & W small speaker system having a woofer and a tweeter. The curve 70 denotes the box resonance with a microphone 3" from the center of the woofer. The curve 74 was developed with the microphone 3" from the center of the tweeter and the curve 72 was developed with the microphone 24" from the center between the woofer and tweeter.

In FIG. 7, the curve 76 represents the reading obtained with two microphones located halfway between the woofer and the tweeter, while the curve 78 represents similar information using one microphone. The curve 80 represents the impedance over the entire frequency spectrum.

Figure 8:
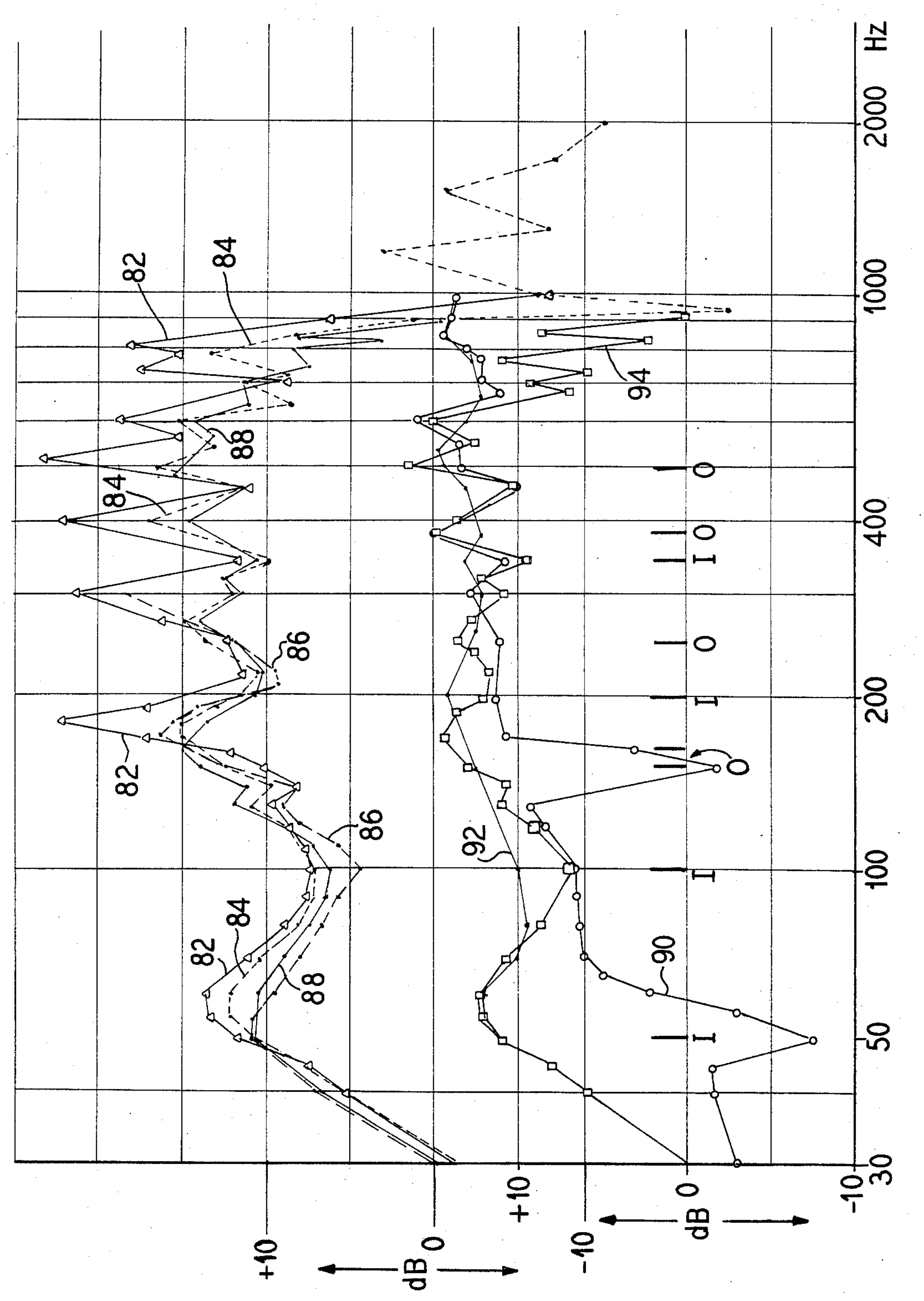
FIG. 8 is a graphic representation of the performance of a speaker system of the type illustrated in FIG. 1 and discussed in greater detail below.

The embodiment of FIG. 1 was tested in several respects as illustrated in FIG. 8. In FIG. 8, the curve 82 represents the sound pressure of the tube with the tube completely hollow, the curve 84 represents the tube with a fiberglass wool insert in the first section and with no resonators, the curve 86 is a similar showing with the wool removed from the first section and placed in the last section and the curve 88 represents the fiberglass wool in the first and second sections.

In the central portion of FIG. 8, the curve 90 represents the face response of the speaker and the curve 92 represents the result of the bass response of the speaker and the response of the open tube illustrated by the curve 82. It should be noted that the fall off at low frequencies only begins at 50 Hz. The curve 94 occurs with the aforementioned wool in the first section and nothing in the second section.

On FIG. 8 there is a plurality of I's and O's. These are some of the frequencies at which the face response and the end response are either in phase (I) or out of phase (O) with one another. It will be noted that the in-phase areas are predominantly at 50, 100, 200, 340, etc Hz, while the out of phase areas (more than indicated) are at 150, 160, 260, 380, 500, etc Hz.

It should be understood that the response curves of FIG. 8 are only for the frequency range of approximately 1000 Hz and below; the response is flat down to 50 Hz.

It has been determined that the amplitude of the cone of the speaker tends to remain constant for approximately 150 Hz down to the ¼ wavelength at which point the cone amplitude is approximately, but not, zero.

In order to determine the "tuning" of the speaker system to approximately ¼ wavelength, the following relationship applies $$v/f_L = \text{wavelength}$$

where v is the velocity of sound and $f_L$ is the lowest desired frequency. With the device of FIG. 1 and the dimensions given, the ¼ wavelength is 61" for a frequency $f_L$ of 50 Hz. As mentioned above, this total mean axial length changes only slightly for a frequency of, for example, 40 Hz or 60 Hz. The utlization of a plurality of angled tubes, however, and the folding of the structure therefore provides a structure with a pleasant appearance and a small height or length. The folding of the structure also reduces the amount of sound pressure eminating from the open end at high frequencies, i.e. above 900 Hz. This is desirable in that it reduces the amount of insulation in the structure and further improves the very low frequency response as well as adjusting the aforementioned in and out of phase relationships.

It should also be pointed out that the ratio of effective speaker cone area to the inner cross-sectional area of the tube affects the sound pressure at the one-quarter wavelength point, and is also related to total tube length. In the above example this ratio is preferably 0.38:1.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A speaker system comprising:

a electromagnetic speaker;

a cylindrical stiff hollow tube mounting said speaker, said cylindrical stiff hollow tube comprising a plurality of serially connected sections, including first and last sections, each connected at an angle to an adjacent section, the combined mean axial lengths of said sections being approximately one-quarter wavelength of a predetermined low frequency, said speaker operable to produce high frequencies and low frequencies; and mounting means mounting said speaker to and facing out of said first end section at one end of said cylindrical tube for emission of the high frequencies from said one end of said tube, and said last end section having an open end for emission of the low frequencies out of said open end of said cylindrical tube.

2. The speaker system of claim 1, wherein:

said plurality of sections are disposed relative to one another such that in a horizontal section therethrough the mean axis defines corners of a polygon.

3. The speaker system of claim 2, wherein:

the polygon is a regular polygon.

4. The speaker system of claim 3, wherein:

the regular polygon is an equilateral triangle.

5. The speaker system of claim 1, wherein:

said plurality of sections are disposed relative to one another that they form a flat Z-shaped structure in an elevation view.

6. The speaker system of claim 1, wherein:

the axes of all sections with the exception of said first end section, lie in the same plane.

7. The speaker system of claim 1, wherein:

said mounting means comprises a hollow cylindrical tubular member including first and second ends which are at an acute angle to one another, said first end mated to said first end section, and said speaker mounted in said hollow cylindrical tubular member recessed from said second end.

8. The speaker system of claim 7, wherein:

said mounting means further comprises a grill; and ring-shaped means mounting said grill at said second end.

9. The speaker system of claim 1, wherein:

each of said sections comprises a spiral wrapped cylindrical cardboard tube, and an outer decorative layer covering said cardboard tube.

10. The speaker system of claim 1, wherein:

said stiff hollow tube comprises first, second, third, fourth and fifth sections, said first, third and fifth sections disposed parallel to one another, said second section connecting said first and third sections, and said fourth section connecting said third and fifth sections, said first and fifth sections respectively constituting said first and last end sections.

11. The speaker system of claim 10, wherein:

the axes of said first, third and fifth sections define an equilateral triangle.

12. The speaker system of claim 11, and further comprising:

a foot extending from the open end of said fifth section for supporting said open end spaced from a supporting surface.

13. The speaker system of claim 10, wherein:

the axes of said first, third and fifth sections are parallel to one another and lie in a common plane; and the axes of said second and fourth sections are parallel to one another and lie in said common plane perpendicular to the axes of said first, third and fifth sections.

14. The speaker system of claim 1, wherein:

said stiff cylindrical hollow tube comprises first, second, third, fourth, fifth and sixth sections, said first and sixth sections respectively constituting said first and last end sections, the axes of said second, third, fourth, fifth and sixth sections lying in a common plane, and the axis of said first section extending perpendicular to said common plane.

15. A speaker system comprising:

a electromagnetic speaker;

a stiff cylindrical hollow tube having a mean axial length equal to approximately one-quater wavelength of a predetermined bass frequency and comprising first, second, third, fourth and fifth serially connected sections with each section connected at an angle to any adjacent section, said fifth section having an open end, the axes of said first, third and fifth sections defining an equilateral triangle; and mounting means mounting said speaker to and facing out of said first section with the axis of said speaker at an acute angle with respect to the axis of said first section, said speaker operable to produce high frequencies and low frequencies, said high frequencies emitted out of said first section of said cylindrical tube and said low frequencies emitted out of said open end of said fifth section of said cylindrical tube.

16. A speaker system comprising:

an electromagnetic speaker;

a stiff cylindrical hollow tube having a mean axial length equal to approximately one-quarter wavelength of a predetermined bass frequency and comprising first, second, third, fourth and fifth serially connected sections with each section connected at an angle to any adjacent section, said fifth section having an open end, the axes of said first, third and fifth sections extending parallel to one another in the same plane; and mounting means mounting said speaker to and facing out said first section with the axis of said speaker at an acute angle with respect to the axis of said first section, said speaker operable to produce high frequencies and low frequencies, said high frequencies emitted out of said first section of said cylindrical tube and said low frequencies emitted out of said open end of said fifth section of said cylindrical tube.

17. A speaker system comprising:

an electromagnetic speaker;

a stiff cylindrical hollow tube having a means axial length equal to approximately one-quarter wavelength of a predetermined bass frequency and comprising first, second, third, fourth, fifth and sixth serially connected sections with each section connected at an angle to any adjacent section, said sixth section having an open end, the axes of said second, third, fourth, fifth and sixth sections lying in a common plane and the axis of said first section extending perpendicular to the common plane; and mounting means mounting said speaker to and facing out of said first section with the axis of said speaker at an acute angle with respect to the axis of said first section, said speaker operable to produce high frequencies and low frequencies, said high frequencies emitted out of said first section of said cylindrical tube and said low frequencies emitted out said open end of said fifth section of said cylindrical tube.

18. In a speaker system in which a single, small, normally high frequency electromagnetic speaker is mounted in and faces out of an enclosure, an improvement providing operation of the speaker over a frequency range normally covered by a tweeter, a midrange speaker and a woofer and providing a small speaker system space and providing a speaker cone amplitude which is essentially constant from approximately 150 Hz down to one-quarter wavelength of a predetermined low frequency at which point the cone amplitude approaches zero, the improvement comprising:

a stiff cylindrical hollow tube constituting the enclosure, said cylindrical tube comprising a first end mounting said speaker, an open second end, an axis having a mean length of approximately the one-quarter wavelength of the predetermined low frequency, and a shape convoluted along said axis such that said first and second ends are physically located less than the one-quarter wavelength apart, said speaker system operable in response to energization of said speaker to emit the high frequencies from said first end of said stiff cylindrical hollow tube and to emit the low frequencies from the open second end of said stiff cylindrical hollow tube.

* * * * *